United States Patent [19]
Hsu et al.

[11] Patent Number: 5,703,514
[45] Date of Patent: Dec. 30, 1997

[54] DIGITAL FREQUENCY DIVIDER PHASE SHIFTER

[75] Inventors: Steve L Hsu, Palos Verdes; Howard S. Nussbaum, Los Angeles; William P. Posey, Palos Verdes Estates; Stephen D. Taylor, Agoura, all of Calif.

[73] Assignee: Hughes Electronics, Los Angeles, Calif.

[21] Appl. No.: 576,329

[22] Filed: Dec. 21, 1995

[51] Int. Cl.$^6$ .................................................. H03H 11/16
[52] U.S. Cl. ......................... 327/237; 327/232; 327/234; 327/276
[58] Field of Search ..................... 327/234, 237, 327/276, 232

[56] References Cited

U.S. PATENT DOCUMENTS

| | | | |
|---|---|---|---|
| 3,721,904 | 3/1973 | Verhoeven | 328/39 |
| 4,608,706 | 8/1986 | Chang et al. | 377/39 |
| 4,870,366 | 9/1989 | Pelletier | 328/140 |
| 4,891,774 | 1/1990 | Bradley | 364/703 |
| 4,991,187 | 2/1991 | Herold et al. | 377/48 |
| 5,066,927 | 11/1991 | Dent | 331/1 A |
| 5,479,458 | 12/1995 | Tanaka | 375/376 |
| 5,521,499 | 5/1996 | Goldenberg et al. | 327/237 |
| 5,554,945 | 9/1996 | Lee et al. | 327/237 |

Primary Examiner—Margaret Rose Wambach
Attorney, Agent, or Firm—Leonard A. Alkov; Wanda K. Denson-Low

[57] ABSTRACT

A phase shifter using digital counters allows extremely accurate phase shifts. In a parallel circuit arrangement of a number of basic phase shift units, which each includes a dual modulus counter and phase control circuitry for controlling the counter modulus, the outputs of several units are combined in parallel. With the divider ratios of all the dividers of the units consisting of roots of pairwise relatively prime numbers, the total number of phase states is equal to the multiplication of its divider ratios.

9 Claims, 7 Drawing Sheets

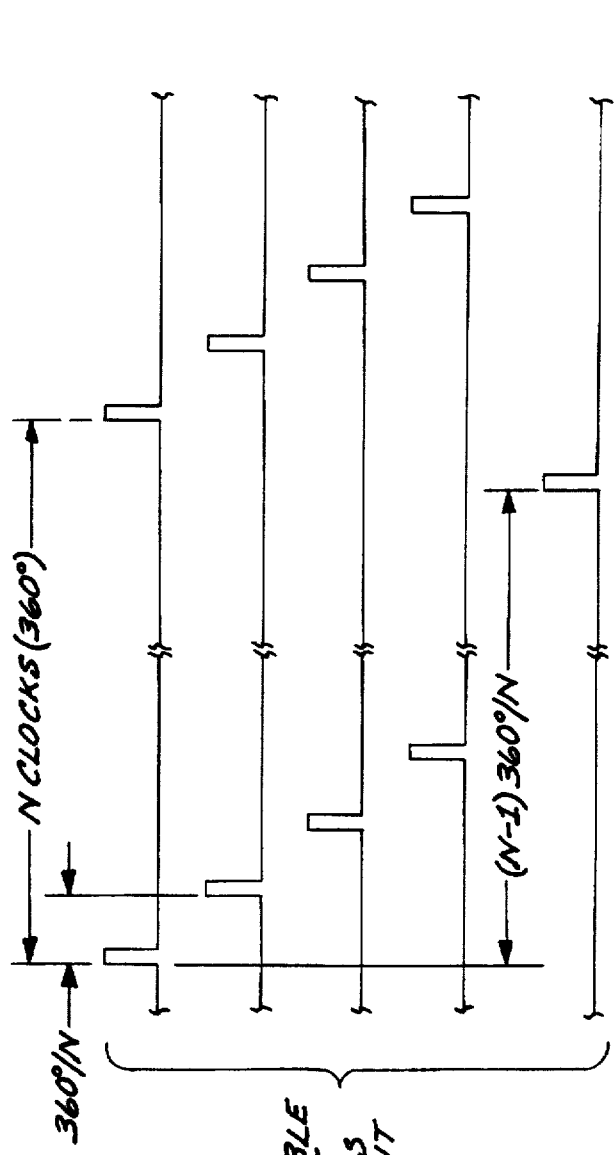

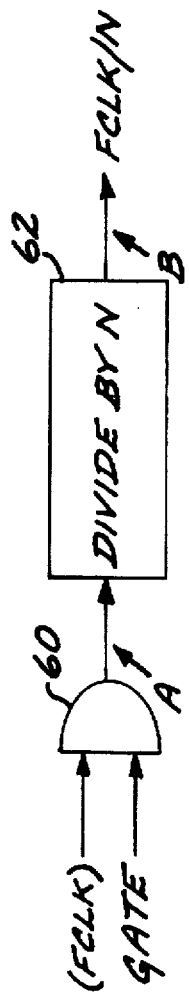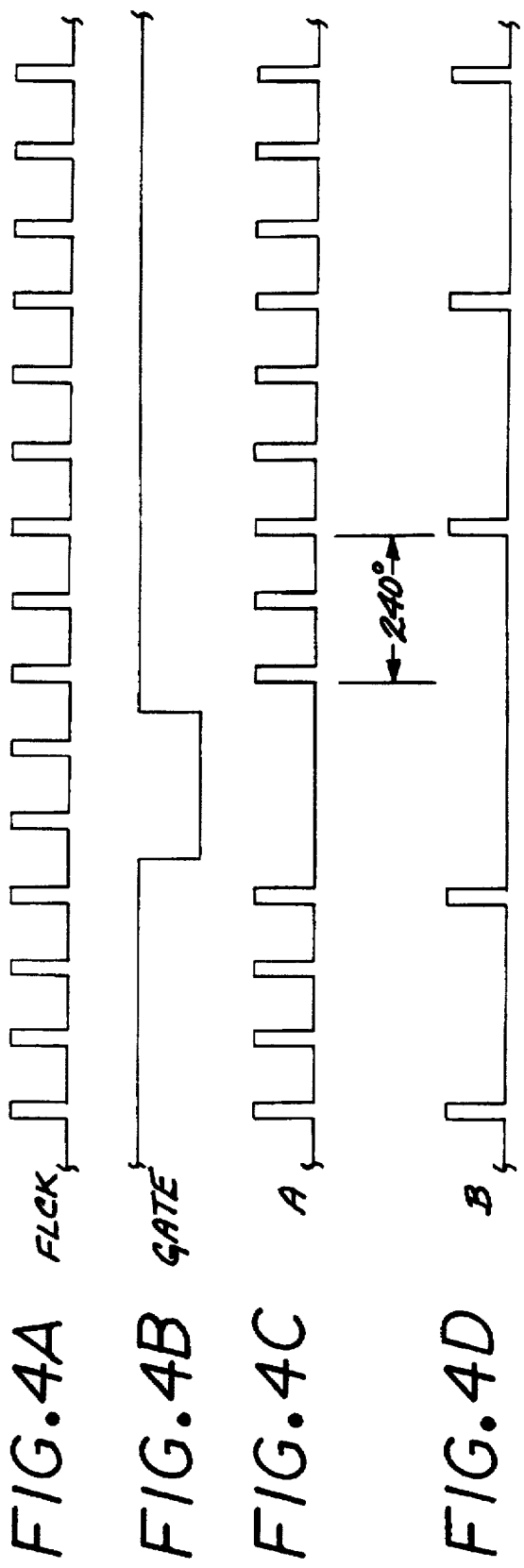
FIG. 3
FIG. 4A FCLK
FIG. 4B GATE
FIG. 4C A
FIG. 4D B

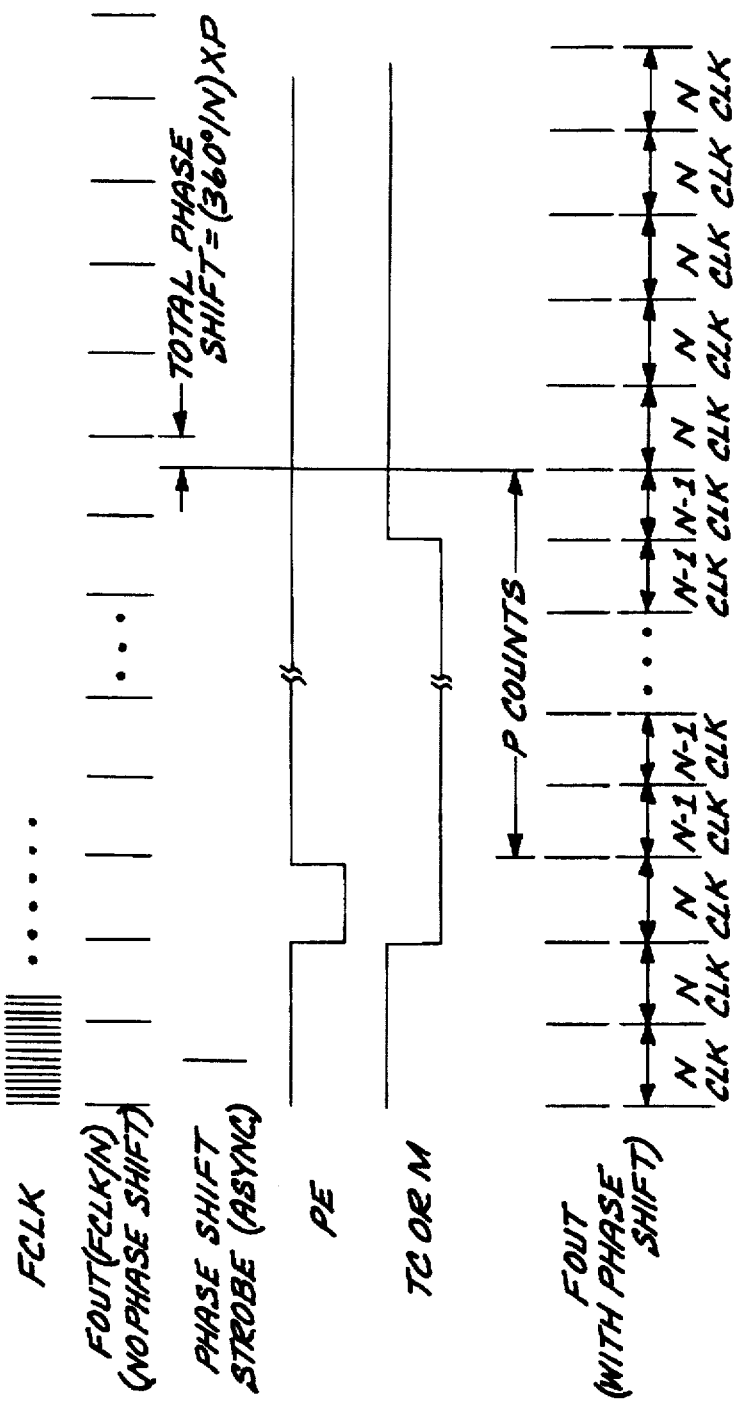

| 134A | 134B | MOD 360° (A+B) OUTPUT PHASE |
|---|---|---|
| 0° | 0° | 0° |
| 0° | 120° | 120° |
| 0° | 240° | 240° |
| 180° | 0° | 180° |
| 180° | 120° | 300° |
| 180° | 240° | 420° ⇒ 60° |

DIGITAL FREQUENCY DIVIDER PHASE SHIFTER

This invention was made with Government support under Contract awarded by the Government. The Government has certain rights in this invention.

CROSS-REFERENCE TO RELATED APPLICATIONS

This application is related to the following copending, commonly assigned applications: DISCRETE PHASE MODULATOR, H. S. Nussbaum et al., Ser. No. 08/576,325, filing date Dec. 21, 1995, attorney docket number PD-93287; SYSTEM AND METHOD FOR RADAR RECEIVER HARMONIC DISTORTION AND SPURIOUS RESPONSE CONTROL, W. P. Posey et al., Ser. No. 08/576,327, filing date Dec. 21, 1995, attorney docket number PD-93283; PRECISION DIGITAL PHASE SHIFTER, S. D. Taylor et al., Ser. No. 08/576,328, filing date Dec. 21, 1995, attorney docket number PD-92593; PRECISION DIGITAL PHASE SHIFT ELEMENT, S. D. Taylor et al., Ser. No. 08/576,330, filing date Dec. 21, 1995, attorney docket number PD-95214; and DIGITAL COUNTER AND COMPARATOR BASED PRECISION PHASE SHIFT ELEMENT, S. D. Taylor et al., Ser. No. 08/576,326, filing date Dec. 21, 1995, attorney docket number PD-95215; the entire contents of these co-pending applications are incorporated herein by this reference.

TECHNICAL FIELD OF THE INVENTION

This invention relates to RF phase shifters, and more particularly to phase shifters employing digital counters to provide extremely accurate phase shifts.

BACKGROUND OF THE INVENTION

Conventional electronic phase shifters used in a radar receiver/exciter include a varactor diode tuned phase shifter which can provide continuous phase shift range, and a phase shifter that uses switches to switch a set of predetermined fixed phased shifters or line lengths. A mixer is commonly used as a high speed bi-phase modulator (180° phase shift). The phase accuracy of these conventional phase shifters is severely limited, which will also limit the number of useful phase states.

SUMMARY OF THE INVENTION

A signal generator is described for generating a plurality of signals having a precise phase relationship. The signal generator includes a plurality of digital frequency divider phase shift circuit units. Each unit is responsive to an input waveform having a given frequency for providing a unit output signal whose frequency is a predetermined ratio of the input waveform frequency and whose phase is selected by a given set of discrete phase changes. The signal generator further includes signal mixing means for combining the plurality of unit output signals to obtain an output signal having a plurality of possible phase states.

The primary advantage of a phase shifter in accordance with the invention is to provide an extremely accurate phase shift to a given signal, many orders of magnitude better than conventional phase shifters. A second advantage is that it can generate large number of phase states by simply adding additional components of similar design and complexity. This is not true with conventional phase shifters which require even more complex and precise hardware to generate greater number of phase states.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is a simplified block diagram of a basic building block unit for a digital frequency divider phase shifter in accordance with the invention.

FIGS. 2A-2F are waveforms illustrating the operation of the phase shifter of FIG. 1. FIG. 2A shows the input signal to the phase shifter. FIG. 2B shows the divider output. FIGS. 2C-2F illustrate N possible respective phase states for the divider output.

FIG. 3 is a simplified phase shifter employing a gate to achieve pulse swallowing.

FIGS. 4A-4D illustrate the pulse swallowing capabilities of the phase shifter of FIG. 3. FIG. 4A is the input waveform. FIG. 4B is the gate waveform. FIG. 4C illustrates the gated input waveform to the phase shifter. FIG. 4D shows the pulse swallowed output of the phase shifter.

FIGS. 6A-6F are waveforms illustrating the operation of the circuit of FIG. 5. FIG. 6A shows the input signal waveform. FIG. 6B shows the output waveform with no phase shift applied by the circuit. FIG. 6C shows the asynchronous phase change trigger signal. FIG. 6D shows PE and TC/M signal waveforms. FIG. 6F illustrates the circuit output waveforms with phase shift applied by the circuit.

DETAILED DESCRIPTION OF THE PREFERRED EMBODIMENT

Figure 5:
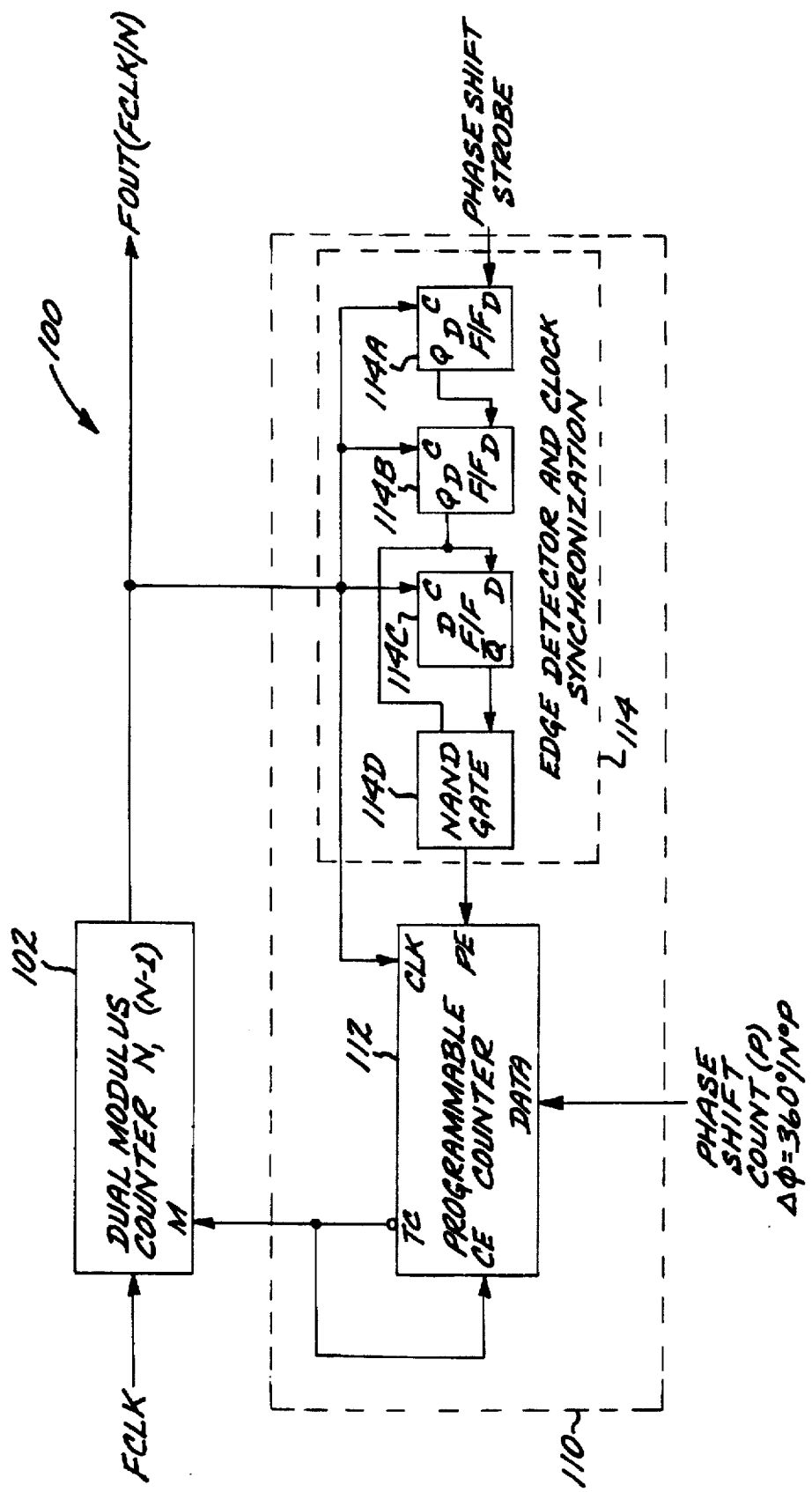
FIG. 5 illustrates a particular circuit implementation of the digital phase shifter unit of FIG. 1.

The basic building block unit for a digital frequency divider phase shifter in accordance with this invention is a frequency divider (divide-by-N) 52 and its associated phase control circuit 54 as shown in FIG. 1. The divider 52 divides the frequency of a clock signal Fclk from a source such as a low noise external reference source. The phase control circuit 54 is responsive to a phase strobe signal and a phase shift control signal indicating the amount of phase shift (ΔΦ) to be introduced upon command by the phase strobe signal.

The output (Fclk/N) of the divider 52 has N possible phase states which are evenly spaced at exactly 360°/N for a constant input clock signal, as shown in FIGS. 2A-2F. The divider output phase is in synchronism with the phase of the input clock signal and, therefore, there is no phase error relative to the input clock other than phase noise of the divider circuit. Using a high spectral purity input clock signal, such as a signal source derived from a crystal oscillator, the phase error from an input signal source is essentially zero. A phase error due to a frequency divider is also small. For example, the phase noise is typically better than −145 dBc/Hz for an ECL device and −160 dBc/Hz for a TTL device. In most cases, divider phase noise can be ignored.

The phase shift of the frequency divider output signal is achieved by changing the phase state of the frequency divider. FIGS. 3 and 4 illustrate a simple "pulse swallowing" technique for providing a change in the frequency divider output phase state. Here, the input signal Fclk is first gated by an AND gate 60 before being subjected to the frequency division function 62. The signal Fclk is one input to the AND gate 60; a gate signal is the other input. FIG. 4A shows the waveform of the input signal Fclk. FIG. 4B shows the gate signal waveform for gating the AND gate 60. FIG. 4C illustrates the resulting waveform at A, the output of the AND gate. FIG. 4D shows the waveform at B, the output of the frequency divider 62. During gating operation, the input clock pulses are "swallowed," i.e., not passed to the input of the frequency divider. Thus, the frequency divider does not see pulses that have been "swallowed" during gating operation, and this results in shifting of the divider output waveform by the number of pulses of Fclk that are gated. As a result of the gating operation, the signal at B is shown to be phase shifted by an exemplary value of 240 degrees.

The primary limitation of using a single frequency divider/phase control building block unit is limited phase resolution and/or slow phase switching speed. Phase switching speed is directly related to the output frequency of the divider. The higher the output frequency, the faster are phase changes through the divider and phase settling through other elements comprising the system of which the phase shift unit is one part. For example, in the case of a radar exciter system employing the phase shift element in accordance with the invention, the exciter system will typically include mixers, amplifiers and filters. Thus, the effect of transient response, i.e., the phase switching speed, through the filters and other components is an important parameter of the phase shifter unit. In general, phase settling through the filter is faster at higher frequencies because higher frequencies allow wider filter bandwidth through which the phase shifted signal can pass through. But, because the output frequency is divided from a clock frequency, the frequency of the phase shifted signal is inherently lower. Furthermore, an increase in the number of phase states requires a direct increase in the divider ratio, further reducing its frequency and, thus, the phase switching speed. Finally, the speed of a digital counter is often limited by the digital semiconductor technology. This invention addresses these limitations.

One way to increase the divider output frequency is to maximize the operating frequency of the frequency divider and its associated phase control circuit. FIG. 5 illustrates a circuit 100 that combines a high speed dual modulus counter 102, for the divider 52 function (FIG. 1), and a programmable counter circuit 110 for the phase state control 54 function (FIG. 1). This type of circuit provides the fastest speed possible within a given logic family. For example, exemplary logic families include TTL and ECL families, as well as GaAs; within the broad TTL and ECL are additional families, e.g., 100K ECL, Fast TTL, etc. Further, within a given logic family, there are different types of devices with differing speeds. For example, flip-flop devices are faster than dual modulus counters, and dual modulus counters are faster than programmable counters. The speed difference is due to complexities such as feedback signal paths of the devices. The circuit of FIG. 5 provides extremely fast performance for a given logic family of devices used to implement the circuit.

The programmable counter circuit 110 includes the programmable counter 112 and an edge detector and clock synchronization circuit 114. The programmable counter 112 receives at its parallel data input the phase shift count value P, and at its PE (parallel enable) port a signal from the circuit 114 which when active causes the P data to be loaded. An active signal from circuit 114 also causes the state of the TC (terminal count) to go to the low state. The TC signal is inverted to the high state; the inverted signal is passed to the modulus control port of the dual modulus counter 102 to change the modulus to the N-1 modulus. The inverted TC signal is also passed to the CE (count enable) port of the programmable counter 112, enabling the counter 112 to count clock pulses received at the CLK (clock) port. The output of the dual modulus counter 102 is connected to this CLK port to provide the clock signal, and also to the circuit 114. Once the count of the programmable counter reaches its terminal count, the TC signal goes high. The high state is inverted, toggling the modulus of the counter 102 and disabling the CE port so that the counter 112 stops counting.

The circuit 114 is responsive to the phase shift strobe signal to generate a parallel enable signal for the counter 112 which is synchronized to the signal output from the counter 102. The circuit 114 includes cascaded D-type flip-flop circuits 114A, 114B and 114C, and NAND gate 114D. The circuit 114 synchronizes the PE signal to the clock signal and delays the PE active signal state by at least one clock cycle in relation to the phase shift strobe signal.

The timing diagram of the circuit 100 is shown in FIGS. 6A–6F. FIG. 6C shows the phase shift strobe signal, 35 and FIG. 6D shows the resulting PE signal, delayed to synchronize with the clock signal of FIG. 6B. FIG. 6E shows the TC signal. FIG. 6F shows the Fout signal with the resulting phase shift.

The dual modulus counter 102 provides two fixed divider ratios which are usually separated by one (N and N-1). The dual modulus counter 102 is a relatively simple device which enables it to run at near the peak speed of a given logic family. A fixed digital divider cannot be used because it cannot induce change in phase states using a slower speed phase control circuit. The phase state is controlled by the programmable counter 110, and due to its complexity, its maximum speed is a fraction of the peak operating frequency of a given logic family. The slower speed of the programmable counter does not slow down the operation of the high speed dual modulus counter because it only has to work at the lower clock speed generated at the output of the high speed dual modulus counter, i.e., Fout =Fclk/N. The phase change is accomplished by controlling the divider ratios of the dual modulus counter 102.

The dual modulus counter 102 is normally run at one of the two divider ratios. For example, the timing diagram of FIG. 6B shows the divider normally running at a divide-by-N ratio. During this normal running time, the count is disabled on the programmable counter. Upon a command to initiate a phase change, the programmable counter 110 is loaded with a count (P) that corresponds to a given phase change, and the count is enabled. While the programmable counter 110 is enabled, the dual modulus counter 102 will run at the other divider ratio (N-1 in this example). Each time the dual modulus counter counts at the other divider ratio, the phase change corresponding to 360°/N (or 360°/(N-1) if N-1 is normally used) occurs. The programmable counter 102 will complete the count defined by the phase shift count (P), and then it will disable itself; furthermore, the dual modulus counter will revert back to the normal divider ratio (N). The total amount of phase shift is equal to (360°/N)P. Further discussion of the dual modulus divider and programmable counter is given in the co-pending, commonly assigned patent applications entitled "PRECISION DIGITAL PHASE SHIFTER", filed Dec. 21, 1995, Ser. No. 08/576,328, attorney docket number PD-92593, "PRECISION DIGITAL PHASE SHIFT ELEMENT," filed concurrently herewith, Ser. No. 08/876,330, attorney docket number PD-95214, and "DIGITAL COUNTER AND COMPARATOR BASED PRECISION PHASE SHIFT ELEMENT," filed concurrently herewith, Ser. No. 08/576,326, attorney docket number PD-95215, the entire contents of which are incorporated herein by reference.

The circuit 100 can be implemented with commercially available components. For example, a prototype using a National Semiconductor 11C90 dual modulus counter (divided by 10 and 11) and a Motorola 10016 4-bit programmable counter has been tested to operate at an 800 MHz clock frequency. In addition, dual modulus and programmable counters using Indium Phosphate (InP) based heterojunction bipolar transistor (HBT) technology have been demonstrated to operated clock frequencies beyond 14 GHz.

A second technique for improving switching speed and for increasing phase resolution is to use a plurality of the basic phase shifter units, each unit including a dual modulus frequency divider having low division ratios. The outputs of the units are combined using mixers and filters. The use of multiple phase shift units dramatically increases the number of phase states compared to using a single phase shift unit with a similar division ratio. Thus, for a given number of phase states, each dual modulus divider ratio can be kept small compared to using a single phase shift unit. This will keep output frequencies of the individual dual modulus dividers high, which improves phase switching speed.

Figures 7A, 7B:
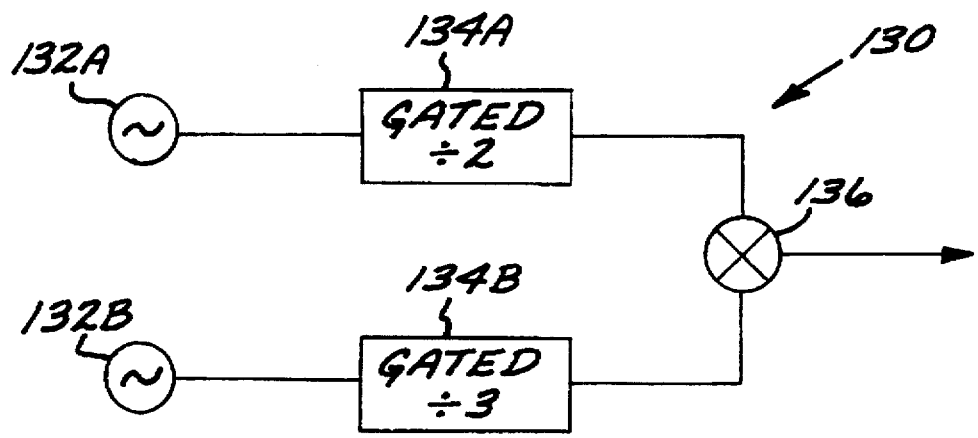
FIG. 7A shows a simple parallel arrangement of phase shift units in accordance with the invention to provide an increased number of possible phase states.
FIG. 7B shows the possible phase states resulting from different states of the two phase shift units of FIG. 7A.

FIG. 7A is a simplified schematic diagram of a phase shift circuit 130 employing a parallel arrangement of two digital phase shifter units 134A and 134B, wherein each unit is a gated circuit as shown in FIG. 3. There are two input signal sources 132A and 132B to illustrate the general case, although a single source may provide the same input signals to both circuits 134A and 134B. In general, the two input signals need not even be of the same frequency. Assume that divider 134A is a divide-by-2 device, with the input gated as shown in FIGS. 3 and 4 to provide two possible output signal phase states, of relative phase 0 degrees and 180 degrees. Assume further that divider 134B is a divide-by-3 device, with the input gated as shown in FIGS. 3 and 4 to provide three possible output signal phase states, of 0 degrees, 120 degrees and 240 degrees. The output signals from the two dividers 134A and 134B are combined at a mixer 136. The output of the mixer 136 includes a product component which is the sum of the frequencies of the input signals, and yields the phase relationship shown in FIG. 7B for the different possible phase states of the dividers 134A and 134B. Thus, FIGS. 7A and 7B illustrate that more than one frequency divider phase shifter can be employed in accordance with the invention to increase the number of total phase shifter states.

Figure 8:
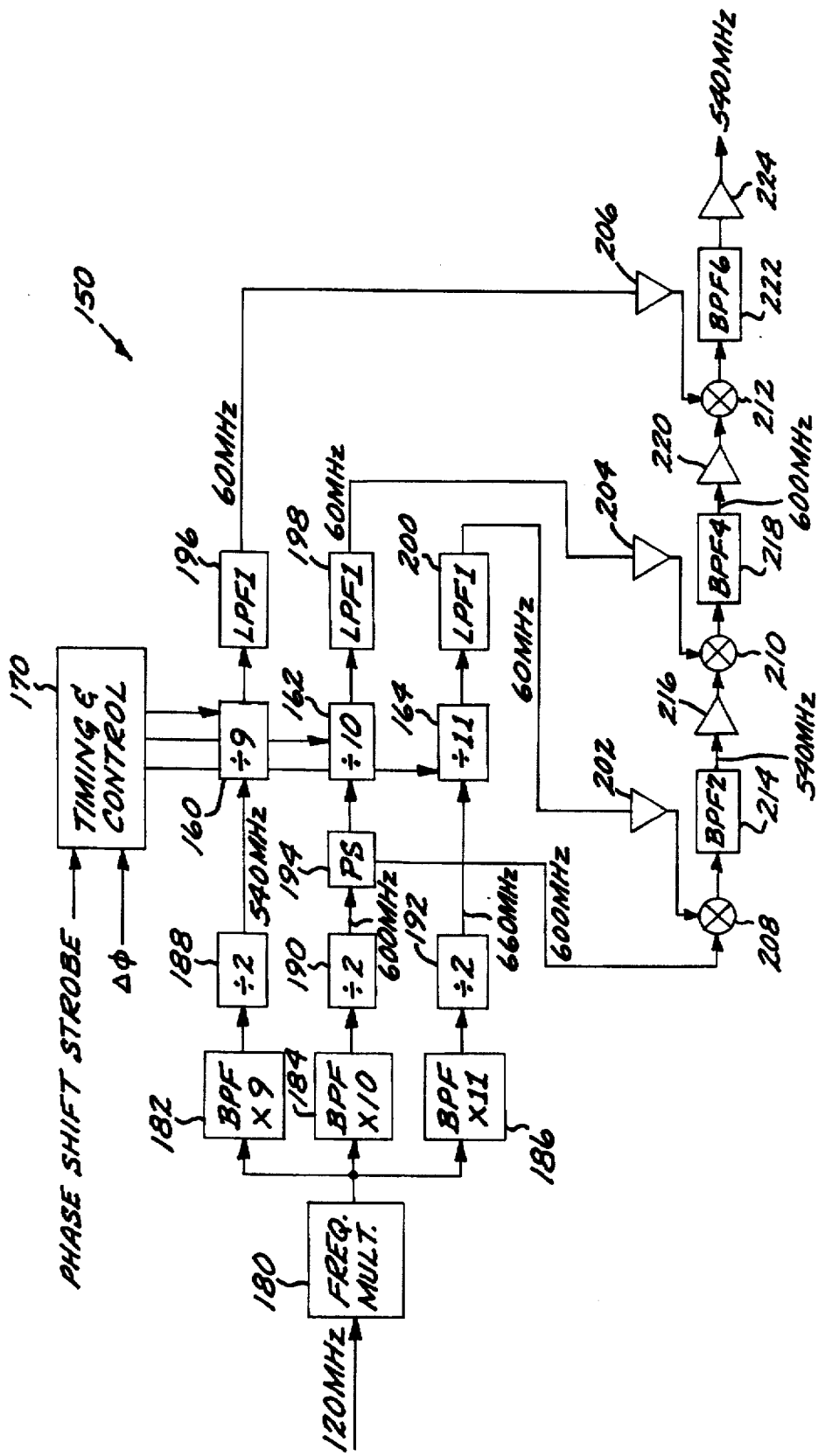
FIG. 8 is a circuit schematic illustrating an exemplary implementation of a digital phase shifter employing multiple divider units in a parallel arrangement.

FIG. 8 shows one exemplary implementation of a frequency divider circuit employing a parallel configuration of the basic units of FIG. 1. In this digital phase shifter 150, the outputs of several of the basic phase shift units are combined in parallel. If the divider ratios of all the units consist of relatively prime numbers, then the total number of phase states is equal to the product of its divider ratios, as provided by the Chinese Remainder Theorem. Relatively prime numbers are defined as numbers that have no common prime number factors. For example, 10 and 9 are relatively prime numbers because the factors of 10 (2 and 5) are not factors of 9 (3 and 3). If this condition does not hold, the total number of phase states is less than the multiplication of divider ratios.

In exemplary circuit 150 of FIG. 8, three dual modulus frequency dividers 160, 162 and 164 are employed. Phase control circuits for controlling each of the dividers are located in the timing and control circuit 170. Divider 160 runs normally at a division ratio of 9, and is selectively put into a divide-by-8 mode by a control signal from the timing and control circuit 170. Divider 162 runs normally at a division ratio of 10, and is selectively put into a divide-by-11 mode by a control signal from the circuit 170. Divider 164 runs normally at a division ratio of 11, and is selectively put into a divide-by-10 mode by a control signal from the circuit 170.

An input reference signal at 120 MHz is passed through a frequency multiplier 180 to provide frequency multiple components of 9, 10 and 11 times the input signal frequency. The multiplier output is passed through three band pass filters (BPFs) 182, 184 and 186 to isolate the desired frequency multiple components at 1080 MHz, 1200 MHz and 1320 MHz, respectively. The BPF outputs are respectively frequency divided by fixed divide-by-2 circuits 188, 190 and 192 to yield respective signals having frequencies at 540 MHz, 600 MHz and 660 MHz. These signals are then passed through the dual modulus dividers 160, 162 and 164, so that the output frequency of the three dividers 160, 162 and 164 are set to 60 MHz during the normal divider ratio operation of the frequency dividers.

The dual modulus divider (160, 162, 164) outputs are then passed to respective mixers 208, 210 and 212 through respective amplifiers 202, 204 and 206. At the first mixer 208, a 60 MHz output signal from divide-by-11 circuit 164 is mixed with a local oscillator (LO) signal at 600 MHz taken at power splitter device 194 at the output of fixed divider 190. BPF 214 is used to isolate the difference frequency at 540 MHz, which after amplification by amplifier 216 becomes the LO signal for the second mixer stage 210. Thus, the 60 MHz signal from the divide-by-10 circuit 162 is mixed with this 540 MHz LO signal taken at the output of amplifier 216. BPF 218 is used to filter out the summed frequency component from operation of mixer 210 at 600 MHz. This summed frequency component is passed through an amplification stage 220. Finally, the mixing process is repeated one more time at mixer 212. Here, the 60 MHz signal from the dual modulus divider circuit 160 and the 600 MHz output of amplification stage 220 are mixed together, and the difference component resulting from the mixing operation is selected by BPF 222 to produce the 540 MHz output signal.

The total number of phase states of the phase shift circuit 150 is 990 (11×10×9) and the phase resolution is approximately 0.3636°. The timing and control circuit 170 can in an exemplary implementation include a lookup table which uses the ΔΦ phase control signal as a table lookup value to access three corresponding phase values. For example, to achieve a desired value B, divider 160 may require a phase control signal to achieve a phase shift B1, divider 162 may require a phase control signal to achieve a phase shift B2, and divider 164 may require a phase control signal to achieve a phase shift B3. The sum of the three phase shifts B1, B2 and B3 equals B. The phase control logic 170 will then supply the proper phase shift commands from the lookup table to the dividers 160, 162 and 164, and the phase change is executed upon receipt of the phase strobe command.

Each divider circuit 160, 162, 164 and phase control circuit 170 can be implemented using the dual modulus counter, programmable counter and edge detector logic and clock synchronization circuit of FIG. 5, but any divider based phase shifter such as the phase shift circuit of FIG. 3 could alternatively be employed.

Any spurious signals created by the mixers 208, 210 and 212 will contribute to phase error. Therefore, the output of the mixers will require proper filtering, and its inter-modulation products have to be controlled where filtering cannot be used. In the implementation shown in FIG. 7, all the signals in the phase shifter are multiples of 60 MHz. Therefore, no spurious signals will be present inside 60 MHz from the carrier. Also, high level mixers, such as the WJM2E mixer available from Watkins-Johnson Company, 333 Hillview Avenue, Palo Alto, Calif. 94304, provide good mixer inter-modulation product suppression.

Finally, by combining the frequency divider/phase control building blocks with other RF processing components, almost any desired phase shifter configuration can be built.

It can be established that the parallel structure in accordance with this invention achieves the claimed number of phase states. First, define $M(i), i=1, \ldots N$, to be the modulo sizes of the counters and $m(i), i=1, \ldots N$, to be the phase settings where the modulo sizes are relatively prime numbers. Then, the output of the system, $s(t)$ is given by $$s(t) = \cos\left(\omega t + \phi + 2\pi \sum_{i=1}^{N} \frac{m(i)}{M(i)}\right)$$

where t is the time variable, $\omega$ is the basic frequency, $\phi$ is the phase prior to applying the prior phase shift, $m(i), i=, \ldots N$ is the settings of the phase shifters, and $M(i), i=1, \ldots N$ is the modulo sizes of the counters in the phase shifters.

This equation is equivalently expressed as $$s(t) = \cos\left(\omega t + \phi + \frac{2\pi}{M}\left(\sum_{i=1}^{N} m(i)\frac{M}{M(i)}\right)\right)_{mod M}$$

where $$M = \prod_{i=1}^{N} M(i)$$

Then, for the system to achieve its goal, there must be a set of values $\{m(i); 0 \leq m(i) \leq M(i) -1\}$ such that $$q = \left(\sum_{i=1}^{N} m(i)\frac{M}{M(i)}\right)_{mod M}$$

for all q in the interval 0 to M-1.

The Chinese Remainder Theorem, a well known theorem in Number Theory, provides the solution to the determination of the set $\{m(i)\}$ and establishes that for each value of q, a unique set $\{m(i)\}$ generates q. This theorem states that q can be represented by its residues. The residues of q are given by $$r_i = q_{mod} M(i)$$

Then, m(i) is given by $$m(i) = (r(i)a(i))_{mod} M(i)$$

where $a_i$ satisfies $$\left(a(i)\frac{M}{M(i)}\right)_{mod M(i)} = 1$$

By restating the equation for a(i) in the form $$1 = \left(M(i)s + a(i)\frac{M}{M(i)}\right)_{mod M}$$

a corollary to the Euclidean Algorithm guarantees that the equation can be solved for a(i) and s since the greatest common divisor of M(i) and M/M(i) is 1.

Thus, one can find a set of thresholds $\{m(i)\}$ through this construction that achieves any of the desired phase states. Alternatively, the settings of the phase shifters can be determined by enumeration of all possible values of n(i), $i=1, \ldots N$, and determining the phase they set.

Figure 9:
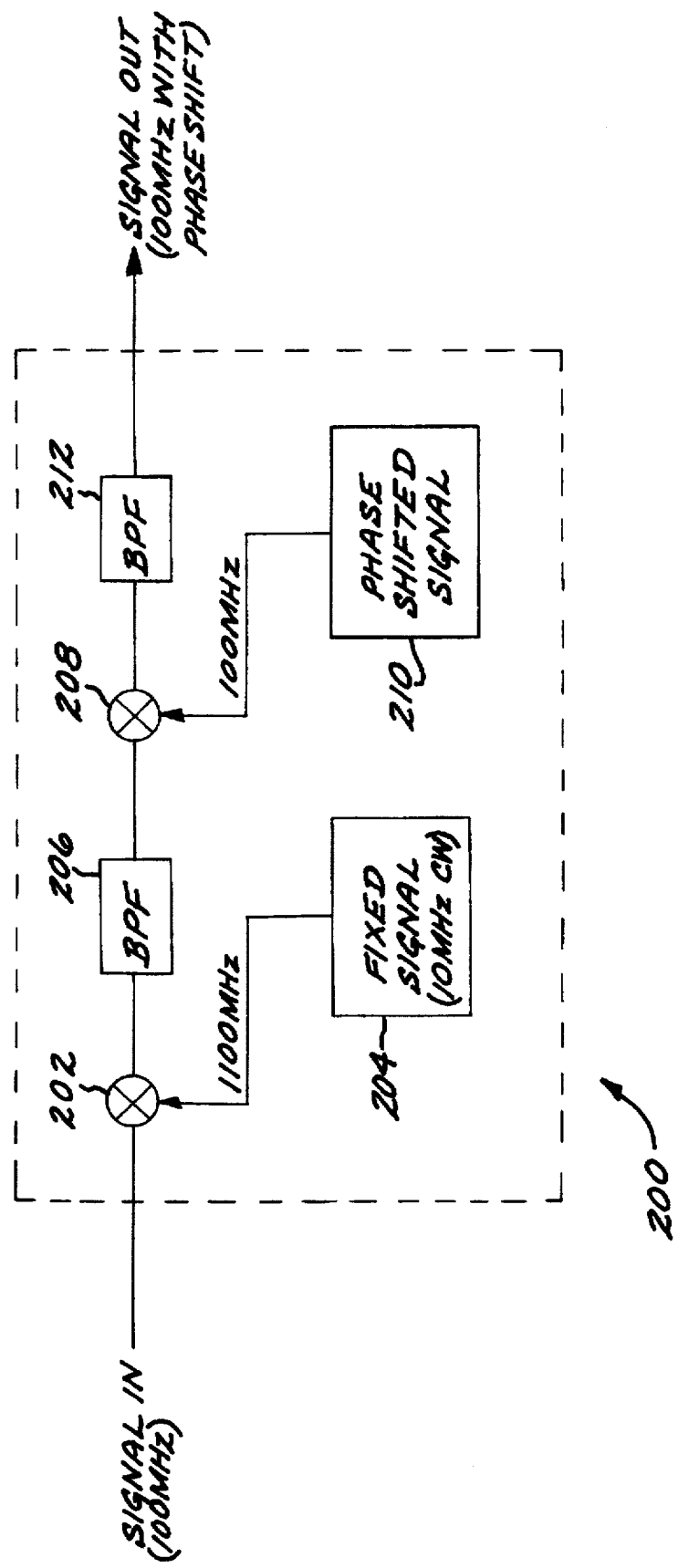
FIG. 9 is a simplified circuit block diagram showing an exemplary implementation of the invention as a phase shift circuit.

The invention can be employed as a signal generator to generate a signal having many possible phase states, or as a phase shift device. For example, the circuit of FIG. 8 can be employed as a signal generator for generating output signals having many possible phase states. Moreover, the circuit of FIG. 8, or even FIG. 1, can be employed in a phase shift circuit. FIG. 9 shows a simple phase shift circuit 200 for shifting the phase of an input signal. Assume for purposes of illustration only that the frequency of the input signal is 100 MHz. This input signal is mixed at mixer 202 with a fixed frequency, fixed phase signal from signal generator 204 having a signal frequency of 10 MHz. The mixer output is passed through a band pass filter (BPF) 206 centered at 110 MHz to isolate the sum component of the mixer output. This sum signal at 110 MHz is then mixed at mixer 208 with a phase modulated signal having a frequency of 10 MHz from device 210. The phase modulated signal can be provided by the circuit 150 of FIG. 8, for example. The difference component of the mixer 208 output is selected by the BPF 212 to provide an output signal at 100 MHz with phase modulation.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A digital phase shift circuit responsive to a periodic pulse train for precisely setting a second phase of a phase shift circuit output signal in relation to a first phase of the phase shift circuit output signal, comprising:

a high speed dual modulus digital counter responsive to the pulse train, the dual modulus counter providing the phase shift circuit output signal, wherein a counter modulus is set to a first number N or a second number N+M by a modulus control signal; and a programmable digital counter circuit generating said modulus control signal, said programmable counter clocked by said circuit output signal and enabled by a phase shift initiation signal to load a phase shift count value corresponding to a given phase change and commence operation to count a number P of output signal pulses determined by said phase shift count value, said programmable counter disabled from counting when said number of pulses has been counted, said modulus control signal having a first state for selecting N as said modulus when said programmable counter is disabled from counting, said modulus control signal having a second state for selecting N+M as said modulus when said programmable counter is enabled, wherein said phase shift circuit output signal is phase shifted from said first phase to said second phase.

2. The circuit of claim 1 further including an edge detection and clock synchronization circuit responsive to an asynchronous phase shift strobe signal to generate said phase shift initiation signal, said phase shift initiation signal synchronized with said circuit output signal.

3. The circuit of claim 1 wherein M is −1, such that said modulus values are N and N-1.

4. A signal generator for generating a plurality of signals having a precise phase relationship, comprising:

a plurality of digital frequency divider phase shift circuit units, each circuit unit responsive to an input waveform having a given frequency for providing a unit output signal whose frequency is a predetermined frequency division ratio of said input waveform frequency and whose phase is selected by a given set of discrete phase changes; and means for combining said plurality of unit output signals to obtain an output signal having a plurality of possible phase states which are combinations of the sets of discrete phase changes of the plurality of digital frequency divider phase shift circuit units.

5. The signal generator of claim 4 wherein said frequency division ratios of said phase shift circuit units consist of relatively prime numbers having no common prime number factors, and the total number of possible phase states is equal to the multiplication of said frequency division ratios.

6. The signal generator of claim 4 wherein each said frequency divider phase shift circuit unit comprises:

a high speed dual modulus digital counter responsive to an input pulse train, the dual modulus counter providing a circuit unit output signal, wherein a counter modulus is set to a first number N or a second number N+M by a modulus control signal; and phase control circuitry for generating the modulus control signal, wherein the counter modulus is normally set to N, and said phase control circuitry selectively sets the counter modulus to N+M for a selected number of cycles of said circuit unit output signal to provide a desired phase shift of said unit output signal in relation to a prior phase of said unit output signal.

7. The signal generator of claim 6 wherein said phase control circuitry includes a programmable digital counter circuit generating a modulus control signal, said programmable counter clocked by said unit circuit output signal and enabled by a phase shift initiation signal to load a phase shift count value corresponding to a given phase change and commence operation to count a number P of output signal pulses determined by said count value, said programmable counter disabled from counting when said number of pulses has been counted, said modulus control signal having a first state for selecting N as said modulus when said programmable counter is disabled from counting, said modulus control signal having a second state for selecting N+M as said modulus when said programmable counter is enabled.

8. The signal generator of claim 4 wherein said combining means includes means for summing in parallel the unit output signals of said respective phase shift circuit units.

9. The signal generator of claim 4 wherein said combining means includes a plurality of cascaded mixers, each mixer for mixing one of said unit output signals with a mixer input signal, wherein a mixer input signal of a second and subsequent mixers is a signal output from the preceding mixer stage, and a mixer input signal for the first mixer is an input signal waveform.

* * * * *